United States Patent
Kim et al.

(10) Patent No.: US 9,136,315 B1
(45) Date of Patent: Sep. 15, 2015

(54) ORGANIC LIGHT EMITTING DISPLAY DEVICE AND METHOD OF MANUFACTURING THE SAME

(71) Applicant: LG Display Co., Ltd., Seoul (KR)

(72) Inventors: Hong Suk Kim, Busan (KR); SooHong Choi, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/583,935

(22) Filed: Dec. 29, 2014

(30) Foreign Application Priority Data

May 30, 2014 (KR) .......................... 10-2014-0066447

(51) Int. Cl.
| | | |
|---|---|---|
| *H01L 29/08* | (2006.01) | |
| *H01L 35/24* | (2006.01) | |
| *H01L 51/00* | (2006.01) | |
| *H01L 21/00* | (2006.01) | |
| *H01L 27/32* | (2006.01) | |
| *H01L 51/56* | (2006.01) | |
| *H01L 51/52* | (2006.01) | |
| *G02F 1/1362* | (2006.01) | |
| *G02F 1/1335* | (2006.01) | |

(52) U.S. Cl.
CPC ........ *H01L 27/3276* (2013.01); *H01L 27/3211* (2013.01); *H01L 27/3258* (2013.01); *H01L 27/3272* (2013.01); *H01L 51/5271* (2013.01); *H01L 51/56* (2013.01); *G02F 1/133512* (2013.01); *G02F 1/136209* (2013.01); *H01L 2227/323* (2013.01); *H01L 2251/5307* (2013.01)

(58) Field of Classification Search
CPC ............ H01L 27/3213; H01L 27/3276; H01L 27/3297; H01L 29/78633; H01L 27/3272; H01L 27/3258; H01L 27/3211; G02F 1/133512; G02F 2001/133388; G02F 2203/02; G02F 1/136209
USPC .............................................. 257/40; 438/34
See application file for complete search history.

(56) References Cited

U.S. PATENT DOCUMENTS

2009/0153764 A1* 6/2009 Hsu et al. ..................... 349/54

* cited by examiner

*Primary Examiner* — Mary Wilczewski
*Assistant Examiner* — Erik T Peterson
(74) *Attorney, Agent, or Firm* — Morgan, Lewis & Bockius LLP

(57) ABSTRACT

Provided are an organic light emitting display (OLED) device and a method of manufacturing the same. The OLED device includes: an array substrate, an intermediate layer over the array substrate, an insulating layer over the intermediate layer, and a plurality of driving signal lines over the insulating layer in a non-display area of the array substrate, the plurality of driving signal lines being completely separated from the intermediate layer by the insulating layer, each of the plurality of driving signal lines being configured to supply a driving signal from a driving circuit unit to a respective sub-pixel of a pixel among a plurality of pixels, wherein the intermediate layer under the plurality of driving signal lines is configured to reduce visibility of the driving signal lines such that incident light on the intermediate layer is uniformly reflected or absorbed with the plurality of driving signal lines.

18 Claims, 8 Drawing Sheets

ORGANIC LIGHT EMITTING DISPLAY DEVICE AND METHOD OF MANUFACTURING THE SAME

CROSS-REFERENCE TO RELATED APPLICATION(S)

The present application claims benefit and priority under 35 U.S.C. §119(a) of Korean Patent Application No. 10-2014-0066447, filed on May 30, 2014, the entire disclosure of which is hereby incorporated by reference herein for all purposes.

BACKGROUND

1. Technical Field

The following description relates to an organic light emitting display device and method of manufacturing the same, and more particularly, to a bottom emission type organic light emitting display device in which a pattern and an outer line of a display panel are not shown.

2. Discussion of the Related Art

Recently, as we increasingly become an information-oriented society, the field of display devices, which visually express an electrical information signal, is rapidly advancing. Flat panel display (FPD) devices, having excellent performance in terms of thinness, light weight, and low power consumption, have been developed. Examples of the FPD devices include LCD devices, plasma display panel (PDP) devices, field emission display (FED) devices, organic light emitting display (OLED) devices, etc.

In particular, the OLED devices are self-emitting devices. In comparison with other FPD devices, the OLED devices have a fast response time, high emission efficiency, high luminance, and a broad viewing angle. Moreover, a high resolution and a large screen are realized. Therefore, the OLED devices are attracting much attention as next-generation display devices.

The OLED devices include an organic emission layer which is formed between two electrodes (a cathode electrode and an anode electrode). An electron and a positive hole are respectively injected from the two electrodes into the organic emission layer, and an exciton is generated by combining the electron with the positive hole. The OLED devices use the principle that light is emitted when the generated exciton drops from an excited state to a ground state.

The OLED devices are categorized into passive matrix OLED devices and active matrix OLED devices, depending on a driving type. The passive matrix OLED devices include a plurality of pixels, which are arranged in a matrix type, without including a thin film transistor (TFT). In the passive matrix OLED devices, power consumption is higher and resolution is more limited than for the active matrix type.

On the other hand, the active matrix OLED devices have a structure in which a plurality of TFTs are respectively formed in a plurality of pixels which are arranged in a matrix type. Each of the plurality of pixels is driven according to a switching operation of a TFT and a voltage charged into a storage capacitor $C_{st}$.

Therefore, the active matrix OLED devices have low power consumption and a high resolution in comparison to the passive matrix organic light emitting display devices. An active matrix OLED device is suitable for a display device requiring a high resolution and a large area. For reference, in the following disclosure, an active matrix OLED device is generally referred to as an OLED device.

FIG. 1 is a diagram illustrating a non-display area and an active area of a related art OLED device.

With reference to FIG. 1, the related art OLED device includes a display panel 1 and a driving circuit unit (not shown) that drives the display panel 1. The display panel 1 includes an array substrate 10 in which a plurality of organic light emitting diodes (OLEDs) and a plurality of pixel circuits for emitting light from the OLEDs are formed, an optical film 20 adhered to a rear surface of the array substrate 10, and an encapsulating substrate 50 that encapsulates the OLEDs.

Here, the organic light emitting display device of FIG. 1 displays an image in a bottom emission type. Therefore, the optical film 20 is adhered to the rear surface of the array substrate 10, and a polarizing film, a film-type patterned retarder (FPR), or a three-dimensional (3D) polarizing film is applied as the optical film 20.

The display panel 1 includes an active area, in which a plurality of pixels 30 are arranged in a matrix type and an image is displayed, and a non-display area. The plurality of pixels 30 are formed in the active area. In order to display a full-color image, a red sub-pixel R, a green sub-pixel G, a blue sub-pixel B, and a white sub-pixel W constitute one pixel 30. Each of the sub-pixels includes an OLED and a pixel circuit, which includes a driving thin film transistor (TFT), a scan TFT, and a sensing TFT.

The driving circuit unit includes a data driver, a gate driver, a timing controller, and a power supply. A plurality of pads (not shown), a plurality of link lines 40, and a plurality of log lines (not shown), which are connected to the driving circuit unit and supply a driving signal to each of the plurality of pixels, are formed in the non-display area. The plurality of link lines 40 and the plurality of log lines are for supplying the driving signal, and are arranged at certain intervals in the non-display area (i.e., an outer portion of the display panel 1) of the display panel 1.

FIG. 2 is a diagram illustrating a problem in which metal lines and a pattern of a space are shown due to reflection of light.

With reference to FIG. 2, external light passes through the optical film 20, and then is reflected by the plurality of link lines 40 and the plurality of log lines. In this case, there is a problem in which metal lines (the link lines and the log lines) and a pattern of spaces are shown due to a space between the plurality of link lines 40 and the plurality of log lines. For this reason, a pattern of the lines formed in the non-display area is visible to a user.

Moreover, in the bottom emission type organic light emitting display device, the encapsulating substrate 50 encapsulates a front surface of the array substrate 10. In this case, the encapsulating substrate 50 covers an entirety of the active area, but covers only a portion of the non-display area. Therefore, an amount of light reflected from an area where the encapsulating substrate 50 is formed differs from an amount of light reflected from an area where the encapsulating substrate 50 is not formed. For this reason, a pattern of the lines formed in the non-display area is very visible to a user.

In the OLED device that displays an image in the bottom emission type, it is desired to increase a sense of beauty by realizing a borderless panel, but since the pattern of the lines formed in the non-display area is recognized, an external aesthetic appearance of the organic light emitting display device is degraded.

SUMMARY

Accordingly, embodiments of the present application are directed to an organic light emitting display device and method of repairing the same that substantially obviate one or more problems due to the limitations and disadvantages of the related art.

An object of embodiments is to provide an organic light emitting display (OLED) device in which a pattern of lines, formed in a non-display area, is prevented from being visible by reflection of light.

Another object is to provide an OLED device in which an amount of light reflected from an area where an encapsulating substrate is formed differs from an amount of light reflected from an area where the encapsulating substrate is not formed, in a non-display area, and thus, a pattern of lines is not visible.

Another object is to provide a bottom emission type OLED device of which an external aesthetic appearance is enhanced by using a borderless panel.

Additional advantages, objects, and features of the disclosure will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose according to one aspect of the invention, there is provided an organic light emitting display (OLED) device, including: an array substrate, an intermediate layer over the array substrate, an insulating layer over the intermediate layer, and a plurality of driving signal lines over the insulating layer in a non-display area of the array substrate, the plurality of driving signal lines being completely separated from the intermediate layer by the insulating layer, each of the plurality of driving signal lines being configured to supply a driving signal from a driving circuit unit to a respective sub-pixel of a pixel among a plurality of pixels, wherein the intermediate layer under the plurality of driving signal lines is configured to reduce visibility of the driving signal lines such that incident light on the intermediate layer is uniformly reflected or absorbed with the plurality of driving signal lines.

In another aspect, there is provided a method of forming an organic light emitting display (OLED) device, the method including: providing an array substrate, providing an intermediate layer over the array substrate, providing an insulating layer over the intermediate layer, and providing a plurality of driving signal lines over the insulating layer in a non-display area of the array substrate, the plurality of driving signal lines being completely separated from the intermediate layer by the insulating layer, each of the plurality of driving signal lines being configured to supply a driving signal from a driving circuit unit to a respective sub-pixel of a pixel among a plurality of pixels, wherein the intermediate layer under the plurality of driving signal lines reduces visibility of the driving signal lines such that incident light on the intermediate layer is uniformly reflected or absorbed with the plurality of driving signal lines.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments. It is to be understood that both the foregoing general description and the following detailed description of the present disclosure are examples and explanatory and are intended to provide further explanation of the disclosure as claimed.

BRIEF DESCRIPTION OF THE DRAWINGS

The accompanying drawings, which are included to provide a further understanding of the invention and are incorporated in and constitute a part of this specification, illustrate implementations of the invention and together with the description serve to explain the principles of the invention.

Figure 1:
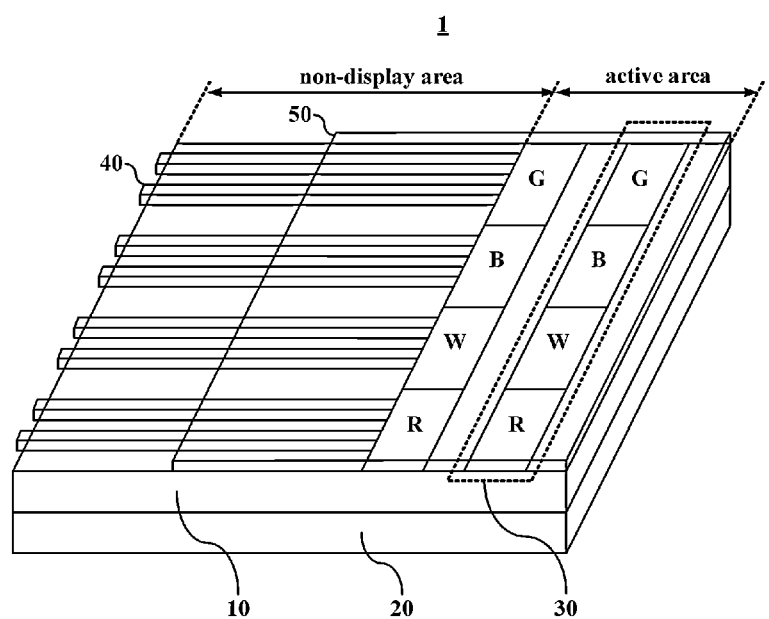
FIG. 1 is a diagram illustrating a non-display area and an active area of a related art organic light emitting display device.
Figure 2:
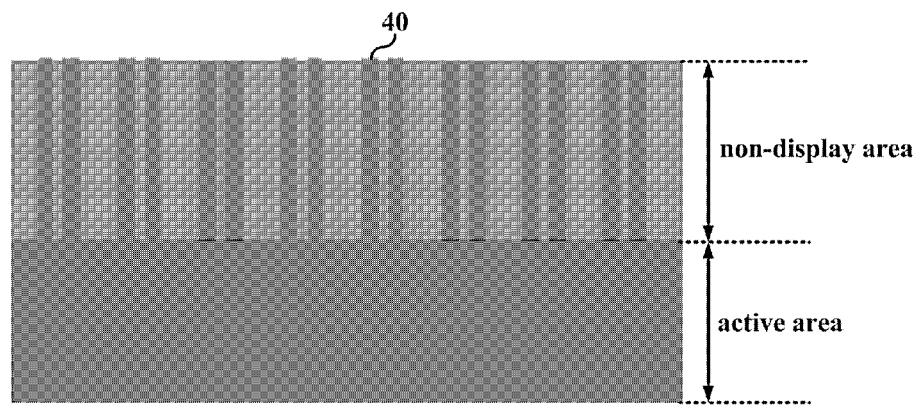
FIG. 2 is a diagram illustrating a problem in which metal lines and a pattern of a space are shown due to reflection of light.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present invention, examples of which are illustrated in the accompanying drawings. In the following description, when a detailed description of well-known functions or configurations related to this document is determined to unnecessarily cloud a gist of the invention, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a certain order. Like reference numerals designate like elements throughout. Names of the respective elements used in the following explanations are selected only for convenience of writing the specification and may be thus different from those used in actual products.

In the description of embodiments, when a structure is described as being positioned "on or above" or "under or below" another structure, this description should be construed as including a case in which the structures contact each other as well as a case in which a third structure is disposed therebetween.

Hereinafter, embodiments will be described in detail with reference to the accompanying drawings.

Figure 3:
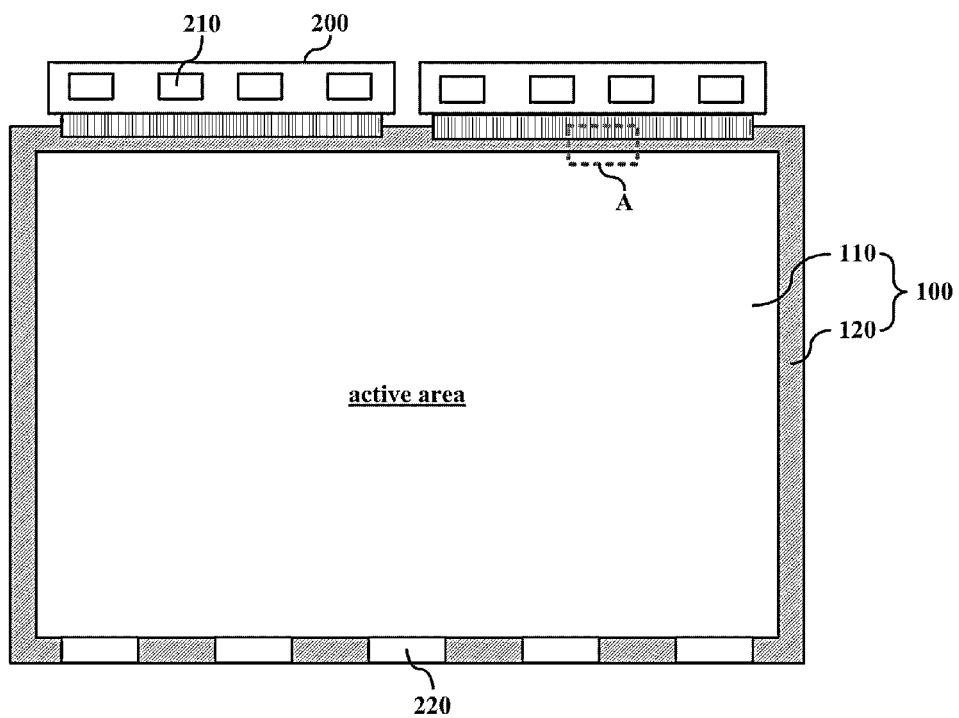
FIG. 3 is a diagram schematically illustrating an organic light emitting display device according to an embodiment.
Figure 4:
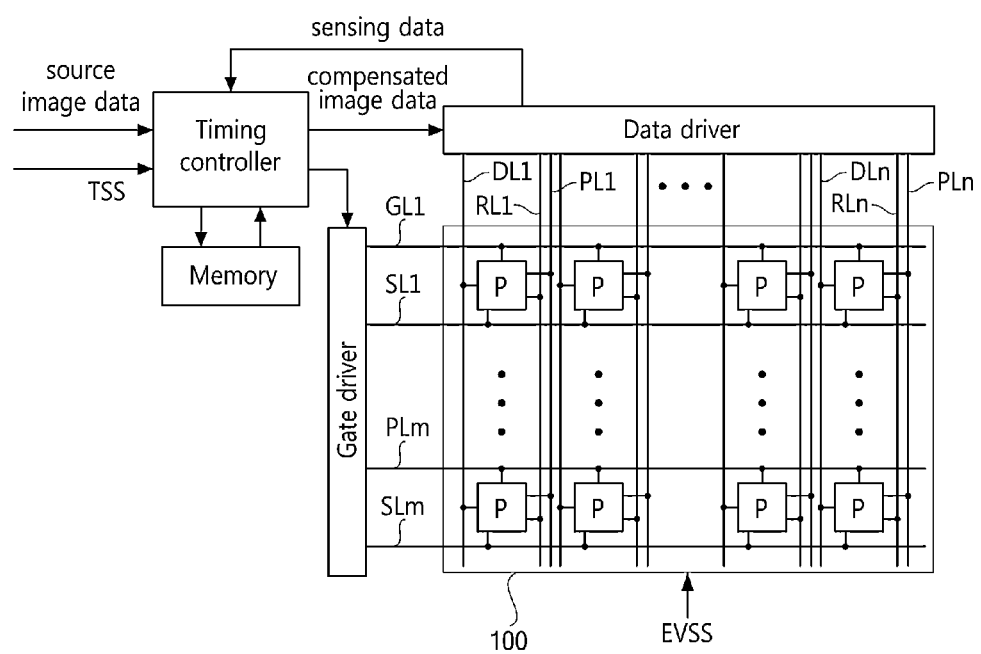
FIG. 4 is a diagram illustrating a display panel and a driving circuit unit.

FIG. 3 is a diagram schematically illustrating an organic light emitting display device according to an embodiment. FIG. 4 is a diagram illustrating a display panel and a driving circuit unit.

With reference to FIGS. 3 and 4, the organic light emitting display (OLED) device according to an embodiment may include a display panel 100 and a driving circuit unit. The driving circuit unit may be provided on a chip-on film (COF) and a printed circuit board (PCB) 200 with a plurality of driving integrated circuits (ICs) 210 mounted thereon, and may supply power and a driving signal to the display panel 100 by using a film-on glass (FOG) 220. The driving circuit unit may include a data driver, a gate driver, a timing controller, a memory, and a power supply.

The timing controller may receive source image data and a timing sync signal TSS. The timing controller may align image data in units of a frame to supply the aligned image data to the data driver. Also, the timing controller may operate the data driver and the gate driver in a driving mode on the basis of the timing sync signal TSS that may be input thereto, thereby displaying an input image. The timing sync signal TSS may include a vertical sync signal Vsync, a horizontal sync signal Hsync, a data enable signal DE, and a clock CLK. Also, the timing controller may operate the data driver and the gate driver in a sensing mode to allow a characteristic (e.g., a threshold voltage/mobility value) of a driving TFT, formed in each of a plurality of sub-pixels, to be sensed.

The gate driver may operate in the driving mode and the sensing mode according to a mode control of the timing controller. In the driving mode, the gate driver may generate a scan signal having a gate-on voltage level in units of one horizontal period according to a gate control signal GCS supplied from the timing controller. The gate driver may sequentially supply the scan signal to a plurality of gate lines GL. In the sensing mode, the gate driver may generate a sense signal having the gate-on voltage level, and may sequentially supply the sense signal to a plurality of sensing signal lines SL.

The gate driver may be connected to the plurality of gate lines GL1 to GLm, the plurality of sensing signal lines SL1 to SLm, and a plurality of power lines (e.g., EVDD lines) PL1-PLm. A low power line EVSS may also be provided, although it should be understood that high and low power may be exchanged with appropriate adjustments understood by one of ordinary skill in the art. The gate driver may be provided in an IC type, and may be connected to the display panel 100, e.g., through a flexible cable. Alternatively, when a transistor may be provided in each sub-pixel P, the gate driver may be directly provided in a non-display area 120 of an array substrate of the display panel 100 through the same process.

The data driver may be connected to a plurality of data lines DL1 to DLn, and may operate in a display mode and in the sensing mode according to the mode control of the timing controller. The data driver may convert compensated image data, supplied from the timing controller, into a data voltage Vdata, and may supply the data voltages to the data line DL. The data driver may also provide sensing data to the timing controller.

The memory may receive data from and may transmit data to the timing controller. The memory may store an initial compensation value for compensating for a shift of a threshold voltage ($V_{th}$) of the driving TFT (DT) of each sub-pixel P. The initial compensation value for compensating for the shift of the threshold voltage ($V_{th}$) of the driving TFT may be loaded from the memory. A loaded compensation value may be reflected in the compensated image data. Also, the memory may store sequential compensation data for compensating for the shift of the threshold voltage ($V_{th}$) of the driving TFT (DT) of each sub-pixel P, based on the driving of the display panel 100. The sequential compensation data stored in the memory may be loaded, and sequential compensation may be performed.

The display panel 100 may include an array substrate, in which a plurality of organic light emitting diodes (OLEDs) and a plurality of pixel circuits for emitting light from the OLEDs are formed, and an encapsulating substrate that encapsulates the OLEDs. The array substrate and the encapsulating substrate will be described below in detail with reference to FIG. 5.

The display panel 100 may include an active area 110, in which a plurality of pixels may be arranged in a matrix type and an image may be displayed; and a non-display area 120 in which a plurality of link lines and a plurality of log lines may be provided.

The plurality of gate lines GL1-GLm, the plurality of sensing signal lines SL1-SLm, the plurality of data lines DL1-DLn, the plurality of power lines PL1-PLm, and a plurality of reference voltage lines RL1-RLn may be formed in the active area 110 of the array substrate. The plurality of sub-pixels P may be defined by the lines. A red sub-pixel, a green sub-pixel, a blue sub-pixel, and a white sub-pixel may constitute one pixel.

Each of the plurality of sub-pixels P may include an OLED and a pixel circuit that emits light from the OLED. The OLED may emit light with a data current ($I_{oled}$) which may be applied via the driving TFT. The plurality of gate lines GL1-GLm and the plurality of sensing signal lines SL1-SLm may be arranged in parallel in a horizontal line (e.g., an X-axis direction) in the display panel 100. In one example, a scan signal (e.g., a gate driving signal) may be applied from the gate driver to each gate line GL1-GLm. A sensing signal may be applied from the gate driver to the sensing signal line SL.

The plurality of data lines DL1-DLn and the plurality of reference voltage lines RL1-RLn may be arranged in parallel in a vertical direction (e.g., a Y-axis direction) in the display panel 100. The plurality of data lines DL1-DLn and the plurality of reference voltage lines RL1-RLn may be formed to intersect the plurality of gate lines GL1-GLm, the plurality of sensing signal lines SL1-SLm, and the plurality of power lines PL1-PLm.

Moreover, the power lines PL1-PLm for supplying a high-level driving voltage (e.g., EVDD) to a plurality of pixels may be formed in the same direction in parallel with the plurality of gate lines GL1-GLm. However, embodiments are not limited thereto. For example, the power lines PL1-PLm may be formed in the vertical direction (e.g., the Y-axis direction) in the display panel 100.

For example, a data voltage ($V_{data}$) may be supplied from the data driver to at least one of the data lines DL1-DLn. The data voltage ($V_{data}$) may include a compensation voltage for compensating for non-uniform luminance and crosstalk in the horizontal direction. Also, a compensation voltage based on a compensation value for compensating for the shift of the threshold voltage ($V_{th}$) of the driving TFT of a corresponding pixel may be additionally added into the data voltage ($V_{data}$).

The data driver may selectively supply a display reference voltage or a sensing precharging voltage to at least one of the reference voltage lines RL1-RLn. The display reference voltage may be supplied to each of the plurality of reference voltage lines RL1-RLn during a data charging period of each sub-pixel P. The sensing precharging voltage may be supplied to the reference voltage lines RL1-RLn during a sensing period in which the threshold voltage/mobility of the driving TFT of each pixel P is sensed, which may be a threshold voltage/mobility value.

Figure 5:
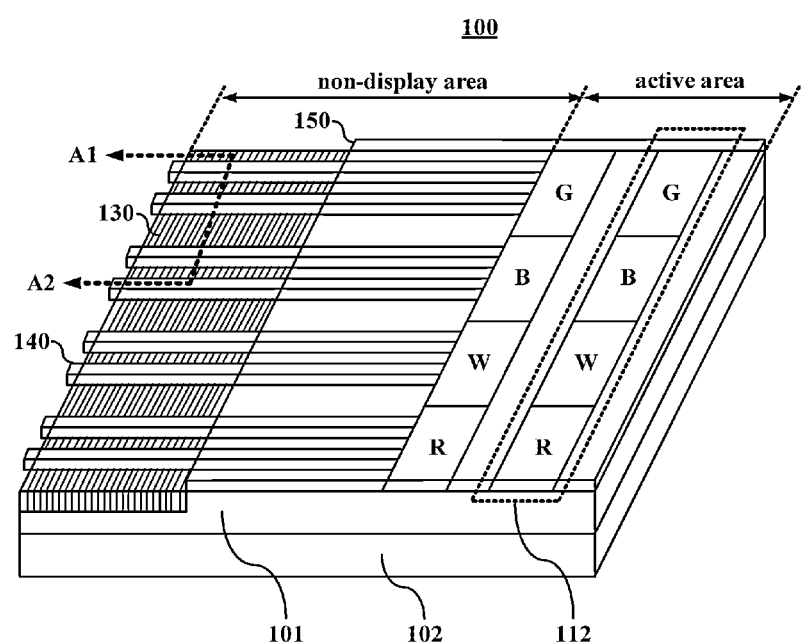
FIG. 5 is a diagram illustrating a portion A of FIG. 3.

FIG. 5 is a diagram illustrating a portion A of FIG. 3. FIG. 5 illustrates an active area (a display area) and a non-display area of a display panel.

With reference to FIG. 5, a bottom emission type display panel 100 may include an array substrate 101, an optical film 102, and an encapsulating substrate 150. The organic light emitting display (OLED) device 100 may display an image in a bottom emission type. For example, the optical film 102 may be adhered to the rear surface of the array substrate 101. A polarizing film, a film-type patterned retarder (FPR), or a three-dimensional (3D) polarizing film may be applied as the optical film 102.

A plurality of pixels 112 may be formed an active area of the array substrate (e.g., the active area 110 of the FIG. 3 example). In order to display a full-color image, a red sub-pixel R, a green sub-pixel G, a blue sub-pixel B, and a white sub-pixel W may constitute one pixel 112. Each of the sub-pixels may include an OLED and a pixel circuit, which may include a driving TFT, a scan TFT, and a sensing TFT).

An encapsulating substrate 150 may be formed to cover an entirety of the active area to physically protect the OLED, formed in each of the sub-pixels, from external interference. Also, the encapsulating substrate 150 may be formed to cover an entirety of the active area and a portion of a non-display area.

A plurality of pads (not shown), a plurality of link lines 140, and a plurality of log lines (not shown), which may be connected to the driving circuit unit and may supply a driving signal to each of the plurality of pixels, may be formed in the non-display area of the array substrate 101. The plurality of link lines 140 and the plurality of log lines may supply the driving signal. The plurality of link lines 140 and the plurality of log lines may be arranged at predetermined intervals in the non-display area of the display panel 100, e.g., at an outer portion of the display panel 100.

One side of each of the link lines 140 and the log lines may be connected to an output terminal of the driving circuit unit. The other side of each of the link lines 140 and the log lines may be connected to the signal lines of the plurality of sub-pixels. A driving voltage and the driving signal may be supplied to each sub-pixel.

When external light is reflected by the lines, the plurality of link lines 140 and the plurality of log lines may be visible to a user. Enhancing an aesthetic appearance of the OLED device by implementing a bottom emission type display panel having no border may be desirable. However, because a pattern of the lines formed in the non-display area is visible due to reflection of light, an external aesthetic appearance of the related art OLED device is degraded.

The OLED device according to an embodiment may include a buffer layer 130 formed between the plurality of link lines 140 and the plurality of log lines. The buffer layer 130 may prevent the pattern of the lines from being visible due to reflection of light in the non-display area.

Figure 6:
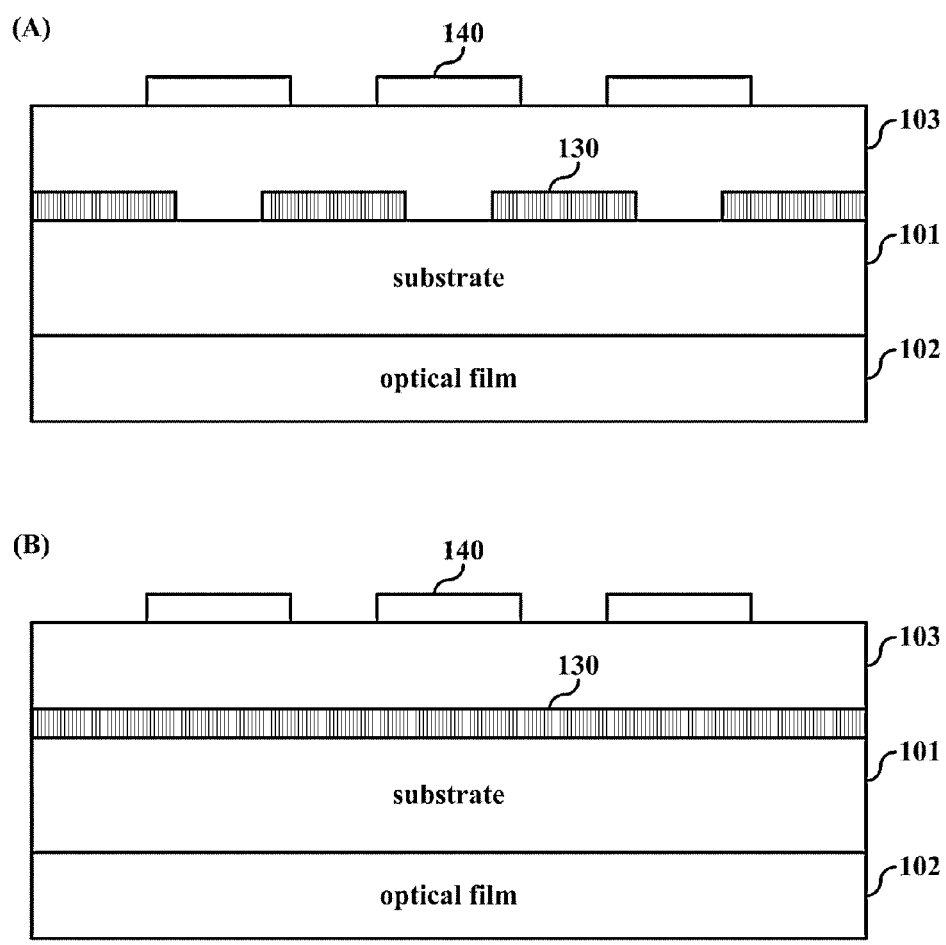
FIG. 6 is a diagram illustrating a cross-sectional surface taken along line A1-A2 of FIG. 5.

FIG. 6 is a diagram illustrating a cross-sectional surface taken along line A1-A2 of FIG. 5. Hereinafter, a detailed example in which the buffer layer 130 is formed for preventing the pattern of the lines from being visible due to reflection of light in the non-display area will be described with reference to FIG. 6.

As illustrated in the FIG. 6 example at (A), the buffer layer 130 may be formed on the array substrate 101 to overlap a space between the plurality of link lines 140. For example, the buffer layer 130 and the plurality of link lines 140 may be formed on different layers with an insulating layer 103 therebetween. The buffer layer 130 may be formed on a first layer on the array substrate 101, and the plurality of link lines 140 may be formed on a second layer.

The buffer layer 130 may be formed, e.g., of a metal material and may have the same light reflection rate as that of the plurality of link lines 140. The plurality of link lines 140 and the buffer layer 130 may be formed of the same metal. However, for example, when there is no difference between light reflection rates, the plurality of link lines 140 and the buffer layer 130 may be formed of different metals.

In the FIG. 6 example at (A), the buffer layer 130 is illustrated as being formed between the plurality of link lines 140, and has been described above. However, embodiments are not limited thereto. For example, the buffer layer 130 may be formed between the plurality of log lines formed in the non-display area, and a space between the plurality of log lines may be filled with the buffer layer 130.

In one example, a width of the buffer layer 130 may be broadly formed to sufficiently cover the space between the plurality of link lines 140 and the space between the plurality of log lines. The buffer layer 130 may be patterned and formed such that an end of the buffer layer 130 may overlap the spaces at a more inward portion than an end of each of the link lines 140 and the log lines.

As described above, the space between the plurality of link lines 140 and the space between the plurality of log lines formed on the array substrate 101 may be filled with the buffer layer 130. Thus, a pattern of the plurality of link lines 140 may be prevented from being visible due to reflection of incident light from the outside.

With reference to the FIG. 6 example at (B), the buffer layer 130 and the plurality of link lines 140 may be formed on different layers with the insulating layer 103 therebetween. The buffer layer 130 may be formed on the first layer on the array substrate 101, and the plurality of link lines 140 may be formed on the second layer. The buffer layer 130 may be formed under the plurality of link lines 140 to cover lower portions of the plurality of link lines 140 and the space between the plurality of link lines.

In the FIG. 6 example at (B), the buffer layer 130 is illustrated as being formed under the plurality of link lines 140, and has been described above. However, embodiments are not limited thereto. For example, the buffer layer 130 may be formed under the plurality of log lines in the non-display area.

As described above, the buffer layer 130 may be formed to cover lower portions of the plurality of link lines 140, lower portions of the plurality of log lines, and a space between the lines. Thus, a pattern of the plurality of link lines 140 may be prevented from being visible due to reflection of incident light from the outside.

When the TFTs of the display panel 100 are formed in a coplanar type, a light shielding layer may be formed under each of the TFTs, and may prevent light from being incident on a semiconductor layer of each TFT. The light shielding layer may be disposed at a lowermost portion of the substrate 101, and the buffer layer 130 may be formed in the non-display area by using a process of forming the light shielding layer in the active area. As described above, when the buffer layer 130 is formed in the non-display area by using a metal pattern and the process of forming the light shielding layer in the active area, without performing an additional process or increasing the manufacturing cost, the pattern of the plurality of link lines may be prevented from being shown due to reflection of incident light from the outside.

However, embodiments are not limited thereto, and the buffer layer 130 may be formed by using a metal pattern, formed on a layer which differs from those of the link lines 140 and the log lines, among a plurality of metal layers formed in the active area. For example, when forming the gate line in the active area, the buffer layer 130 may be formed in the non-display area by using a gate metal pattern and a process of forming the gate line.

Figure 7:
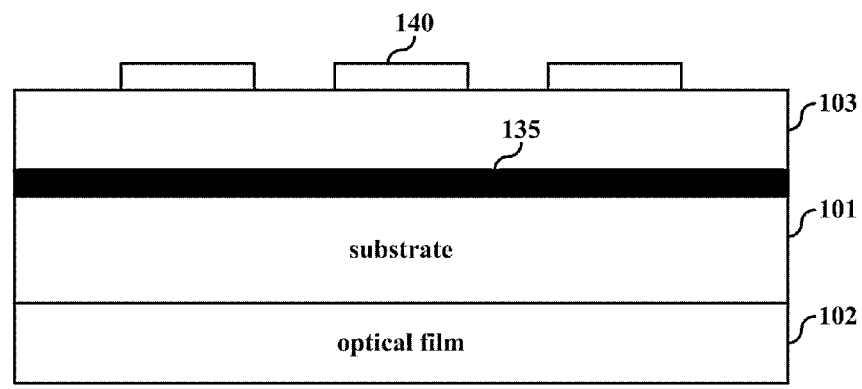
FIG. 7 is a diagram illustrating a cross-sectional surface of a non-display area according to an embodiment.

FIG. 7 is a diagram illustrating a cross-sectional surface of a non-display area according to an embodiment.

With reference to FIG. 7, a light shielding layer 135 may be formed under the plurality of link lines 140 and on the array substrate 101. In one example, the light shielding layer 135 and the plurality of link lines 140 may be formed on different layers with the insulating layer 103 therebetween. The light shielding layer 135 may be formed on a first layer on the array substrate 101, and the plurality of link lines 140 may be formed on a second layer. The light shielding layer 135 may be formed under the plurality of link lines 140 to cover the lower portions of the plurality of link lines 140 and the space between the plurality of link lines.

In the FIG. 7 example, the light shielding layer 135 is illustrated as being formed under the plurality of link lines 140, and has been described above. However, embodiments are not limited thereto. For example, the light shielding layer 135 may be formed under the plurality of log lines formed in the non-display area. The light shielding layer 135 may be formed, e.g., of a black pigment that absorbs light.

As described above, the light shielding layer 135 may be formed to cover the lower portions of the plurality of link lines 140, the lower portions of the plurality of log lines, and the space between the lines. Thus, the pattern of the plurality of link lines may be prevented from being visible due to reflection of incident light from the outside.

Figure 8:
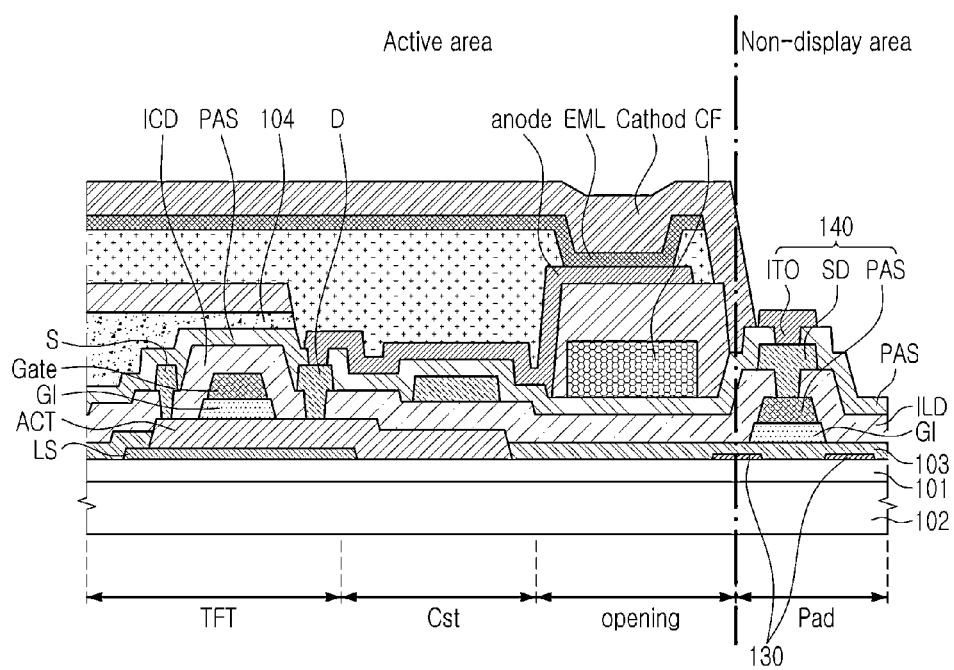
FIG. 8 is a diagram illustrating a cross-sectional structure of a pixel disposed in an active area and a cross-sectional structure of a light shielding layer disposed in a non-display area.

FIG. 8 is a diagram illustrating a cross-sectional structure of a pixel disposed in an active area and a cross-sectional structure of a light shielding layer disposed in a non-display area.

In the FIG. 8 example, one of the plurality of pixels disposed in the active area is illustrated. Also, one link line 140 of the plurality of link lines disposed in the non-display area is illustrated. Also, two buffer lines of the plurality of buffer lines 130 disposed in the non-display area are illustrated.

With reference to FIG. 8, the optical film 102 may be disposed under the array substrate 101. The optical film 102 may use a polarizing film a film-type patterned retarder (FPR), or a 3D polarizing film.

A light shielding layer LS may be disposed in the active area, and the plurality of buffer lines 130 may be disposed in the non-display area, on the array substrate 101. An active layer ACT of a TFT may be disposed on the array substrate 101 and the light shielding layer LS. The insulating layer 103 may be disposed to cover a portion of the active layer ACT and the plurality of buffer lines 130.

In the active area, a gate insulator GI may be disposed on the active layer ACT, and a gate electrode Gate may be disposed on the gate insulator GI. In the non-display area, the gate insulator GI may be disposed at a portion, corresponding to a space between the plurality of buffer lines 130, on the insulating layer 103. A pad PAD may be disposed on the gate insulator GI. The gate electrode Gate in the active area and the pad PAD in the non-display area may be formed of the same metal material. An inter-layer dielectric ILD may be disposed on the gate electrode Gate and the pad PAD.

A source electrode S, connected to a first side of the active layer ACT through the inter-layer dielectric ILD in the active area, and a drain electrode, connected to a second side of the active area ACT, may be disposed. As described above, a driving TFT may be configured with the active layer ACT, the gate insulator GI, the source electrode S, and the drain electrode D. Moreover, a source/drain metal layer SD, connected to the pad PAD through the inter-layer dielectric ILD in the non-display area may be disposed.

A passivation layer PAS may be disposed to cover the driving TFT in the active area. Also, the passivation layer PAS may be disposed on the source/drain metal layer SD in the non-display area.

A color filter CF may be disposed in an opening. A light blocking layer 104, which prevents light from being incident on the driving TFT, may be disposed on the driving TFT. The light blocking layer 104 may be formed by the color filter CF, and a red color filter among red, green, and blue color filters may be applied as the light blocking layer 104.

An overcoat layer OC may be disposed to cover the color filter CF and the light blocking layer 104. The overcoat layer OC may not be disposed at a portion where the drain electrode D of the driving TFT is disposed.

An anode electrode, connected to the drain electrode D through the passivation layer PAS in the active area, may be disposed. The anode electrode may be disposed from the drain electrode D of the driving TFT to a storage capacitor area and the opening. The anode electrode may be disposed on the color filter CF and the overcoat layer OC which may be disposed in the opening. A bank defining the opening may be disposed on the anode electrode, and an emission layer EML may be disposed in the opening defined by the bank. The emission layer EML may be disposed on the anode electrode. A cathode electrode may be disposed on the emission layer EML.

A transparent conductive layer ITO, connected to the source/drain metal layer SD through the passivation layer PAS in the non-display area, may be disposed. As described above, the pad PAD, the source/drain metal layer SD, and the transparent conductive layer ITO may be sequentially stacked, thereby forming the link line 140.

As described above, the buffer layer 130 and the link line 140 may be disposed on different layers on the array substrate 101. The plurality of buffer lines 130 may be disposed in a space between the plurality of link lines 140. The space between the plurality of link lines 140 may be filled with the plurality of buffer lines 130. Therefore, a pattern of the plurality of link lines 140 can be prevented from being shown by reflection of light incident from the outside.

Figure 9:
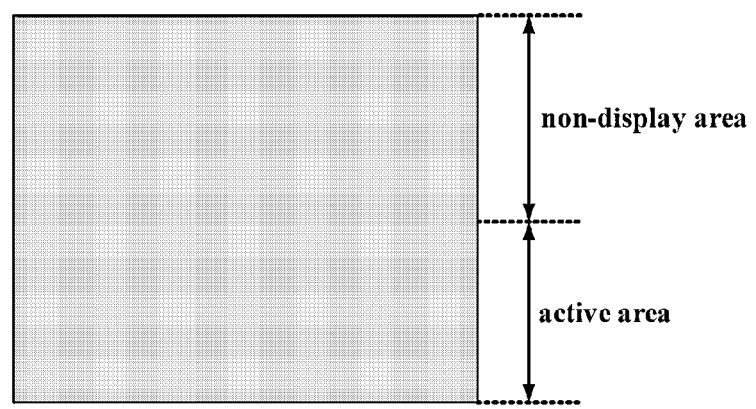
FIG. 9 is a diagram illustrating that a metal line and a pattern of a space are not shown by using a buffer layer or a light shielding layer.

FIG. 9 is a diagram illustrating that a metal line and a pattern of a space are not visible by using a buffer layer or a light shielding layer.

With reference to FIG. 8, as described above, because the buffer layer 130 or the light shielding layer 135 may be formed under the plurality of link lines and the plurality of log lines, light incident on the non-display area may be uniformly reflected or absorbed. Thus, the pattern of the lines may be prevented from being shown.

Moreover, an amount of light reflected from an area where the encapsulating substrate is formed may be the same as an amount of light reflected from an area where the encapsulating substrate is not formed, or the pattern of the lines formed in the non-display area may not be visible by absorbing light.

Moreover, embodiments may prevent the pattern of the lines from being visible in the non-display area. Thus, an external aesthetic appearance of the bottom emission type OLED device to which a borderless panel is applied may be enhanced.

In the OLED device according to an embodiment, the buffer layer may be formed of metal which reflects light. Moreover, in the OLED device according to an embodiment, the buffer layer may be formed to overlap the space between the plurality of link lines. In addition, in the OLED device according to an embodiment, the buffer may be formed to overlap the lower portions of the plurality of link lines and the space between the plurality of link lines.

Furthermore, in the OLED device according to an embodiment, each of the plurality of pixels may include the OLED and the pixel circuit that drives the OLED, the TFTs of the pixel circuit may be formed in a coplanar structure, the light shielding layer may be formed under the TFTs, and the buffer layer may be formed on the same layer as that of the light shield layer. Moreover, in the OLED device according to an embodiment, each of the plurality of pixels may include: the OLED, the pixel circuit that drives the OLED, the gate line through which the driving signal may be supplied to the pixel circuit, and the data line through which a driving current may be supplied to the OLED. Also, the buffer layer may be formed on the same layer as that of the gate line. In addition, in the OLED device according to an embodiment, the light shielding layer may overlap the lower portions of the plurality of link lines and the space between the plurality of link lines.

In the OLED device according to embodiments, the buffer layer may overlap an space between the lines formed in the non-display area. Thus, the pattern of the lines formed in the non-display area may be prevented from being visible to a user. In the OLED device according to embodiments, the buffer layer or the light shielding layer may be under the lines formed in the non-display area. Thus, the pattern of the lines formed in the non-display area may be prevented from being visible to a user.

In the OLED device according to embodiments, an amount of light reflected from an area where the encapsulating substrate is formed may be the same as an amount of light reflected from an area where the encapsulating substrate is not formed, or the pattern of the lines formed in the non-display area may not be visible by absorbing light. Moreover, an external aesthetic appearance of the bottom emission type OLED device to which a borderless panel is applied may be enhanced.

It will be apparent to those skilled in the art that various modifications and variations can be made in the present invention without departing from the spirit or scope of the inventions. Thus, it is intended that embodiments of the present invention cover the modifications and variations of this invention provided they come within the scope of the appended claims and their equivalents.

What is claimed is:

1. An organic light emitting display (OLED) device, comprising:
    an array substrate;
    an intermediate layer over the array substrate;
    an insulating layer over the intermediate layer; and
    a plurality of driving signal lines over the insulating layer in a non-display area of the array substrate, the plurality of driving signal lines being completely separated from the intermediate layer by the insulating layer, each of the plurality of driving signal lines being configured to supply a driving signal from a driving circuit unit to a respective sub-pixel of a pixel among a plurality of pixels,
    wherein the intermediate layer under the plurality of driving signal lines is configured to reduce visibility of the driving signal lines such that incident light on the intermediate layer is uniformly reflected or absorbed with the plurality of driving signal lines, such that the reflection or absorption of incident light prevents the plurality of driving signal lines from being visible, and
    wherein at least a portion of the intermediate layer extends laterally to overlap all of a space between at least two of the plurality of driving signal lines.

2. The OLED device of claim 1, wherein the driving signal lines comprise link lines.

3. The OLED device of claim 1, wherein the intermediate layer is a buffer layer.

4. The OLED device of claim 3, wherein the buffer layer comprises a metal material.

5. The OLED device of claim 4, wherein the plurality of link lines comprise a same metal material as that of the buffer layer.

6. The OLED device of claim 5, wherein the metal material of the buffer layer has a same light reflection rate as that of the plurality of link lines.

7. The OLED device of claim 1, wherein the intermediate layer is a light shielding layer.

8. The OLED device of claim 7, wherein the light shielding layer comprises a dark pigment material.

9. The OLED device of claim 7, wherein a striped pattern of the driving signal lines is visually obscured by the intermediate layer.

10. A method of forming an organic light emitting display (OLED) device, the method comprising:
    providing an array substrate;
    providing an intermediate layer over the array substrate;
    providing an insulating layer over the intermediate layer; and
    providing a plurality of driving signal lines over the insulating layer in a non-display area of the array substrate, the plurality of driving signal lines being completely separated from the intermediate layer by the insulating layer, each of the plurality of driving signal lines being configured to supply a driving signal from a driving circuit unit to a respective sub-pixel of a pixel among a plurality of pixels,
    wherein the intermediate layer under the plurality of driving signal lines reduces visibility of the driving signal lines such that incident light on the intermediate layer is uniformly reflected or absorbed with the plurality of driving signal lines, such that the reflection or absorption of incident light prevents the plurality of driving signal lines from being visible, and
    wherein at least a portion of the intermediate layer extends laterally to overlap all of a space between at least two of the plurality of driving signal lines.

11. The method of claim 10, wherein providing the driving signal lines comprises providing link lines.

12. The method of claim 10, wherein the intermediate layer is a buffer layer.

13. The method of claim 12, wherein the buffer layer comprises a metal material.

14. The method of claim 13, wherein the plurality of link lines comprise a same metal material as that of the buffer layer.

15. The method of claim 14, wherein the metal material of the buffer layer has a same light reflection rate as that of the plurality of link lines.

16. The method of claim 10, wherein the intermediate layer is a light shielding layer.

17. The method of claim 16, wherein the light shielding layer comprises a dark pigment material.

18. The method of claim 16, wherein a striped pattern of the driving signal lines is visually obscured by the intermediate layer.

* * * * *